(12) United States Patent
Terashima

(10) Patent No.: US 6,329,228 B1
(45) Date of Patent: Dec. 11, 2001

(54) SEMICONDUCTOR DEVICE AND METHOD OF FABRICATING THE SAME

(75) Inventor: Kazuhiko Terashima, Tokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/559,311

(22) Filed: Apr. 27, 2000

(30) Foreign Application Priority Data

Apr. 28, 1999 (JP) .................................................. 11-122659

(51) Int. Cl.[7] ...................................................... H01L 21/00
(52) U.S. Cl. ........................... 438/156; 438/121; 438/123; 438/126; 438/108; 257/675; 257/737; 257/787; 29/832; 29/840
(58) Field of Search ..................................... 438/156, 121, 438/123, 126, 108, 615; 257/787, 675, 737; 29/840, 832

(56) References Cited

U.S. PATENT DOCUMENTS 5,920,117 * 7/1999 Sono et al. .......................... 257/675
6,074,567 * 6/2000 Kuraishi et al. ...................... 216/18
6,157,085 * 12/2000 Terashima ........................... 257/783

* cited by examiner

Primary Examiner—Richard Elms
Assistant Examiner—Pho M. Luu
(74) Attorney, Agent, or Firm—Armstrong, Westerman, Hattori, McLeland & Naughton, LLP

(57) ABSTRACT

A semiconductor device having a PBGA structure comprising a wiring board, a semiconductor integrated circuit chip, substrate electrodes of the semiconductor integrated circuit chip for electrically connecting the electrodes of the semiconductor integrated circuit chip to the wiring board by connection wires, and a resin sealing body for covering the entire surface of the wiring board to protect the semiconductor integrated circuit chip, wherein the semiconductor integrated circuit chip and the substrate electrodes are respectively provided on the front surface of the wiring board. The semiconductor device further comprising pad electrodes and solder ball terminals respectively provided on the back surface of the wiring board for connecting the wiring board to a mother board, and through holes provided on the wiring board for connecting the substrate electrodes provided on the front surface of the wiring board to the pad electrodes provided on the back surface of the wiring board, wherein the resin sealing body is curved in shape at the peripheral portions.

2 Claims, 6 Drawing Sheets

SEMICONDUCTOR DEVICE AND METHOD OF FABRICATING THE SAME

BACKGROUND OF THE INVENTION

1. Field of the Invention

This invention relates to a construction of a semiconductor device comprising a semiconductor integrated circuit chip mounted on a wiring board and sealed with a resin, and a method of fabricating the same, more particularly to a construction of a plastic ball grid array having a resin sealing body on the front surface of the wiring board on which the semiconductor integrated circuit chip is mounted and solder ball terminals on the back surface thereof, and a method of fabricating the same.

2. Description of the Related Art

The semiconductor integrated circuit chip is generally used when it is sealed by a package, which has functions of electrically connecting each electrode and a mother board, protecting a circuit and radiating heat.

A plastic ball grid array which is a type of this package (hereinafter referred to as PBGA) is a surface multi-terminal package having a construction such that a semiconductor integrated circuit chip is mounted on the front surface of a wiring board formed mainly of a resin composite, solder ball terminals provided in a matrix on the entire back surface of the wiring board for connecting the wiring board and a mother board, and the periphery of the semiconductor integrated circuit chip is sealed with a resin.

The PBGA structure is advantageous compared with other packages in respect of miniaturization of the package, electric properties and mounting yield and so forth, and it is particularly employed in the fields of personal computers and cellular communication equipment.

A semiconductor device having a conventional PBGA structure is described with reference to FIG. 17. FIG. 17 is a schematic sectional view of the conventional semiconductor device.

A semiconductor device 22 comprises a wiring board 1 having a core formed of a substantially square resin board 13, and a semiconductor integrated circuit chip 2, a plurality of connection wires 7 for electrically connecting each electrode of the semiconductor integrated circuit chip 2 with the wiring board 1, and a plurality of substrate electrodes 3 which are respectively mounted on the wiring board 1.

The semiconductor device 22 has a die pad 4 for fixing the semiconductor integrated circuit chip 2 onto the front surface of the wiring board 1 using a die bond adhesive 6.

Formed on the front surface of the wiring board 1 are a resin insulating film 5 for covering and protecting each substrate electrode 3 and wirings, and a resin sealing body 28 for sealing and protecting the semiconductor integrated circuit chip 2, the connection wires 7 and the substrate electrodes 3.

Pad electrodes 9 are formed on the back surface of the wiring board 1 corresponding to the substrate electrodes 3, and solder ball terminals 10 for electrically connecting the wiring board 1 and a mother board, not shown, are soldered onto the pad electrodes 9.

The resin insulating film S is also provided on the back surface of the wiring board 1 for covering and protecting the pad electrodes 9 and the wirings.

The semiconductor device 22 has through holes 11 for electrically connecting each substrate electrode 3 on the front surface of the wiring board 1 and each pad electrode 9 on the back surface of the wiring board 1.

There are provided a plurality of substrate electrodes 3, through holes 11, pad electrodes 9 and solder ball terminals 10 although only two pieces are illustrated in FIG. 17, for illustration reasons.

A method of fabricating the semiconductor device having the conventional PBGA structure is now described.

The wiring board 1 on which the semiconductor integrated circuit chips 2 are mounted is formed with the resin board 13 as the core which is substantially square and has a thickness of about 0.4 mm.

As a material of the resin board 13, a glass fiber reinforced epoxy resin or a glass fiber reinforced BT resin is employed both having an excellent insulating property.

A plurality of semiconductor integrated circuit chips 2 can be mounted on the common wiring board 1 in given intervals as shown in FIG. 18, so that the semiconductor integrated circuit chips 2 having the PBGA structure can be fabricated at a time in order to reduce the fabricating time and improve fabricating yield.

First, copper foils each having a thickness of about 18 $\mu$m are stuck to the front and back surfaces of the resin board 13 serving as the core of the wiring board 1 as shown in FIG. 17.

Then, cylindrical holes for providing the through holes 11 are provided on the resin board 13 having the copper foil thereon by perforating means such as a cutting drill.

Thereafter, electroless copper plating is applied to the entire surface of the perforated resin board 13 including the inner peripheral surfaces of the cylindrical holes provided on the resin board 13, thereby forming a copper plating layer so that the through holes 11 for electrically connecting the copper foils formed on the front and back surface of the resin board 13, and the copper film formed of an electric plating layer.

The copper films formed on the front and back surfaces of the resin board 13 on which the through holes 11 are provided are patterned by an etching treatment using an etching prevention film which is a photoresist, and etchant.

The substrate electrodes 3, the die pad 4 and a wiring pattern, not shown are provided on the front surface of the resin board 13 and the pad electrodes 9 and another wiring pattern, not shown are provided on the back surface of the resin board 13 by the etching treatment.

As mentioned above, the wiring board 1 is designed to mount the plurality of semiconductor integrated circuit chips 2.

Accordingly, the number of die pads 4 provided corresponds to the number of semiconductor integrated circuit chips 2 to be mounted on the front surface of the one piece of resin board 13. Further, a plurality of substrate electrodes 3 are arranged along each end of the substantially square to surround the respective die pads 4.

Further, the number of pad electrodes 9 formed on the back surface of the resin board 13 corresponds to the number of terminals of the semiconductor integrated circuit chips 2 and the number of semiconductor integrated circuit chips 2 to be mounted. The pad electrodes 9 per one semiconductor integrated circuit chip 2 are arranged in a matrix on the back surface of the resin board 13 in given intervals.

Thereafter, the resin insulating film 5 is provided on the front surface of the resin board 13 so as to cover the wiring pattern and the openings of the through holes 11 while the substrate electrodes 3 and the die pads 4 are exposed. Further, the resin insulating film 5 is also provided on the back surface of the resin board 13 so as to cover the wiring pattern and the openings of the through holes 11 while the pad electrodes 9 are exposed.

As a material of the resin insulating film 5, an acrylic resin or epoxy resin respectively having an excellent insulating property is used.

The wiring board 1 shown in FIG. 17 is completed in the foregoing processes.

Then, as shown in FIG. 18, a plurality of semiconductor integrated circuit chips 2 are bonded onto the die pad 4 shown in FIG. 17 using the die bond adhesive 6. As a material of the die bond adhesive 6, a thermosetting resin adhesive is used.

Thereafter, each electrode of the plurality of semiconductor integrated circuit chips 2 mounted on the wiring board 1 as shown in FIG. 18 and each substrate electrode 3 provided around the semiconductor integrated circuit chips 2 as shown in FIG. 17 are electrically connected to one another by the connection wires 7. As a material of the connection wires 7, an aluminum wire or a gold wire is used.

A flow stop 14 is provided substantially square along the outer periphery of the wiring board 1 as shown in FIG. 18 to form an outer shape of the resin sealing body for sealing the plurality of semiconductor integrated circuit chips 2, connection wires 7 and substrate electrodes 3 respectively mounted on the wiring board 1.

As a material of the flow stop 14, a thermosetting epoxy resin composite or a silicon composite is used.

Thereafter, a liquid sealing resin is poured into the inside of the flow stop 14 so as to form a resin sealing body 28 of each semiconductor integrated circuit chip 2 at the same time.

If the liquid sealing resin is continuously poured into the inside of the flow stop 14, the flow is stopped by the flow stop 14 and the surface of the liquid sealing resin swells owing to surface tension. When a plurality of semiconductor integrated circuit chips 2 and each connection wire 7 provided on the front surface of the wiring board I are sufficiently concealed by the liquid sealing resin, the supply of the liquid sealing resin is stopped. Then, the liquid sealing resin is heated and cured.

As a material of the liquid sealing resin, a thermosetting epoxy resin composite which has an excellent insulating property and adhesiveness is used. If a filler such as silica is added to the liquid sealing resin, sealing reliability can be improved.

Thereafter, a solder ball having a diameter in the order of 0.6 mm to 0.8 mm is supplied to the pad electrodes 9 provided on the back surface of the wiring board 1 and it is heated using a heating furnace to form solder ball terminals 10.

Then, the wiring board 1 and the cured sealed resin are cut from each other into each semiconductor integrated circuit chip 2 using a dicing saw while they are cooled by pouring water, thereby the semiconductor devices 22 are separated individually.

In the foregoing method, the semiconductor device 22 constituting or having the conventional PBGA is completed.

Since the semiconductor device 22 constituting the conventional PBGA is fabricated by pouring a liquid sealing resin inside the flow stop 14 provided along the periphery of the wiring board 1 on which a plurality of semiconductor integrated circuit chips 2 are mounted, and heating and curing the liquid sealing resin, then cutting the sealing resin of every semiconductor device 22, the corners of peripheral portions 28a of the resin sealing body 28 stand upright as shown in FIG. 17.

Accordingly, in the semiconductor device 12 having the conventional PBGA, the peripheral portions of the resin sealing body 28 are susceptible to breakage. If the peripheral portions of the resin sealing body 28 are broken, a stress is localized on the broken parts to produce cracks therein, causing a problem of serious impairment of reliability of the semiconductor device.

Further, there arises another problem that the broken pieces produced by the breakage of the peripheral portions of the resin sealing body 28 impede the functions of other electronic parts and parts conveying units.

Still further, when a plurality of semiconductor integrated circuit chips 2 mounted on the wiring board 1 are sealed by liquid sealing resin, the sealing resin is cured and shrinks, resulting in the occurrence of warpage of the wiring board 1.

In the case of sealing the semiconductor integrated circuit chips 2 at a time, the curing shrinkage amount is increased because the volume of the cured sealing resin is increased, and the warpage of the wiring board 1 becomes larger.

If the warpage of the wiring board 1 is large, a wiring board 1 can not be mounted on a dicing saw, hence the semiconductor devices 22 can not be cut into each device.

Even if the wiring board 1 can be mounted on the dicing saw, there arises a problem that a stress is not applied to the wiring board 1 while severing the semiconductor devices 22, causing a generation of exfoliation or breakage of the semiconductor integrated circuit chips 2 and the resin sealing body 28.

The invention has been developed to solve the foregoing problems and has an object to provide a semiconductor device in which peripheral portions of a resin sealing body are not broken during transportation, so that the functions of other electronic parts and parts conveyance units are not impeded, thereby obtaining a semiconductor device having a highly reliable PBGA structure.

It is another object of the invention to provide a method of fabricating a semiconductor device capable of preventing the wiring board from being warped owing to the curing and shrinkage of a sealing resin halfway through the fabrication, thereby sealing a plurality of semiconductor integrated circuit chips at a time, and preventing the exfoliation and breakage of the semiconductor integrated circuit chips and sealing body.

SUMMARY OF THE INVENTION

To achieve the above objects, the semiconductor device of the invention comprises a wiring board, a semiconductor integrated circuit chip, substrate electrodes of the semiconductor integrated circuit chip for electrically connecting the electrodes of the semiconductor integrated circuit chip to the wiring board by connection wires, and a resin sealing body for covering the entire surface of the wiring board to protect the semiconductor integrated circuit chip, wherein the semiconductor integrated circuit chip, the substrate electrodes and the resin sealing body are respectively provided on the front surface of the wiring board. Said semiconductor device further comprises pad electrodes and solder ball terminals respectively provided on the back surface of the wiring board for connecting the wiring board to a mother board, and through holes provided on the wiring board for connecting the substrate electrodes provided on the front surface of the wiring board to the pad electrodes provided on the back surface of the wiring board, wherein the resin sealing body is curved in shape at the peripheral portions.

Further, to achieve the above objects, the method of fabricating a semiconductor device of the invention comprises the following steps.

That is, the method comprises the steps of: preparing a wiring board by forming copper foils on front and back surfaces of a resin board, perforating the wiring board for providing through holes; and a copper plating step for applying a copper plating to the wiring board on the entire surface thereof including inner peripheral surfaces of holes so as to provide the through holes for electrically connecting the copper foils to copper films formed of copper plated layers respectively formed on the front and back surfaces of the wiring board.

Further, the method comprises the steps of: a first patterning step for patterning the copper film on the front surface of the wiring board for forming a plurality of substrate electrodes to be electrically connected to each electrode of the semiconductor integrated circuit chip; a second patterning step for patterning the copper film on the back surface of the wiring board to form a plurality of pad electrodes which are electrically connected with each substrate electrode through through holes and to be connected a plurality of solder ball terminals; forming resin insulating films on the front and back surfaces of the wiring board while each substrate electrode and each pad electrode are exposed; fixing a semiconductor integrated circuit chip onto a substantially central portion of the front surface of the wiring board using an adhesive; and a connecting step for electrically connecting each electrode of the semiconductor integrated circuit chip and each substrate electrode by connection wires.

Still further, the method is characterized in comprising the steps of: perforating the wiring board for providing substantially square outer slits so as to form the outer shape of a resin sealing body for covering and protecting the semiconductor integrated circuit chip while leaving four corners of the outer slits; said perforating step being effected subsequently to either step of the foregoing steps ranging from the step of preparing the wiring board to the connecting step; forming a resin sealing body for covering and protecting the semiconductor integrated circuit chip on the wiring board and the entire surface of the inner side of the outer slits including the substrate electrode; soldering the solder ball terminals onto each pad electrode; and cutting the four corners of the outer slits where the wiring board is not perforated for the outer slits.

Further still, it is preferable that the step of forming the resin sealing body is a step of supplying a thermosetting liquid sealing resin to the entire surface of the outer slits including the semiconductor integrated circuit chips inside the outer slits, then heating and curing the sealing resin to form the resin sealing body.

The invention has the following features.

According to the semiconductor device of the invention, the peripheral portions of the resin sealing body sealing the entire front surface of the semiconductor device so as to protect the semiconductor integrated circuit chips are curved in shape.

Accordingly, the peripheral portions of the resin sealing body are not easily broken during the transportation, and there does not arise a problem that cracks are produced in the resin sealing body to seriously impair the reliability of the semiconductor device.

Further, there does not arise a problem that broken pieces produced by the breakage of the peripheral portions impede the functions of other electronic parts and parts conveying units.

Further, the method of fabricating a semiconductor device of the invention has the step of perforating the wiring board for providing substantially square outer slits so as to form the outer shape of a resin sealing for every semiconductor integrated circuit chip while leaving four corners of the outer slits before forming the resin sealing body for covering and protecting the integrated circuit, and has the step of cutting the four corners of the outer slits where the wiring board is not perforated for the outer slits after forming the resin sealing body.

Accordingly, it is possible to provide the resin sealing body for every semiconductor integrated circuit chip by the foregoing outer slits in the step of sealing a plurality of semiconductor integrated circuit chips mounted on the wiring board using a liquid sealing resin, and each peripheral portion of the resin sealing body can be curved in shape.

Still further, when the sealing resin is cured on the wiring board on which the plurality of semiconductor integrated circuit chips are mounted, each sealing resin which is separated by the outer shape slits is cured. Accordingly, the shrinkage volume of the sealing resin caused by the curing can be suppressed compared with a conventional method of curing a large volume of sealing resin integrated with a plurality of semiconductor integrated circuit chips so that the wiring board is not warped.

Accordingly, a stress is not applied to the wiring board when severing the respective semiconductor devices into individual ones, and exfoliation or breakage of the semiconductor integrated circuit chips and resin sealing body is not generated.

The above and other objects, features and advantages of the invention will be apparent from the following detailed description which is to be read in conjunction with the accompanying drawings.

DETAILED DESCRIPTION OF THE PREFERRED EMBODIMENTS

Figure 1:
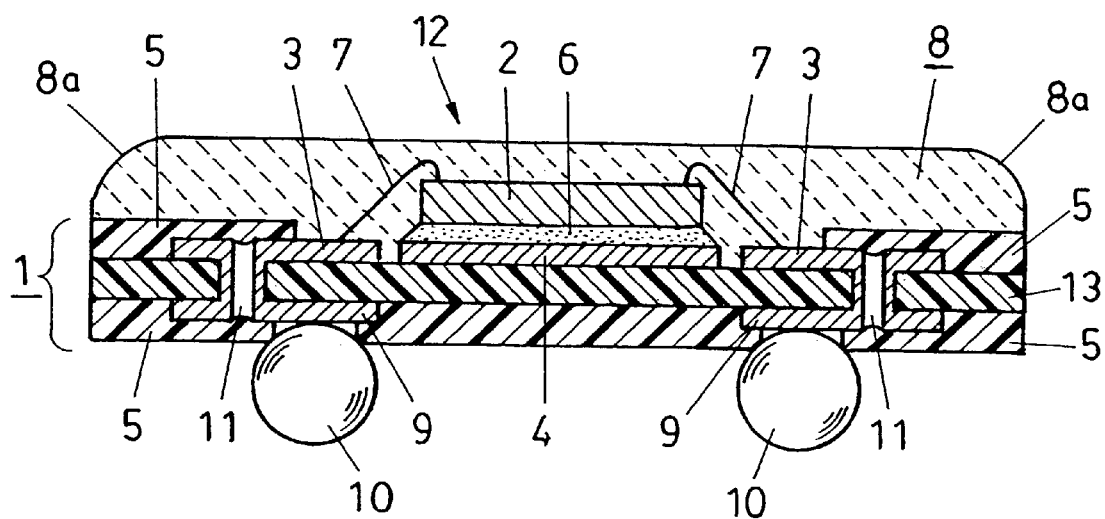
FIG. 1 is a schematic sectional view showing the construction of a semiconductor device having a PBGA structure according to an embodiment of the invention.

A method of fabricating a semiconductor device according to an optimal embodiment of the invention is described in detail with reference to drawings hereinafter. Semiconductor Device: FIG. 1

Figure 17:
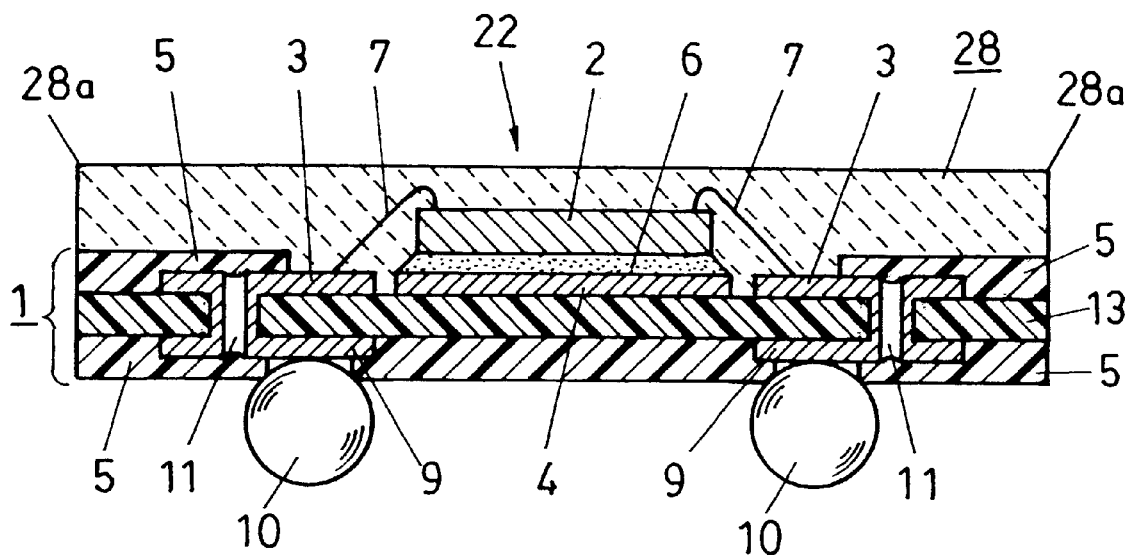
FIG. 17 is a schematic sectional view showing the construction of a semiconductor device having a conventional PBGA structure.
Figure 18:
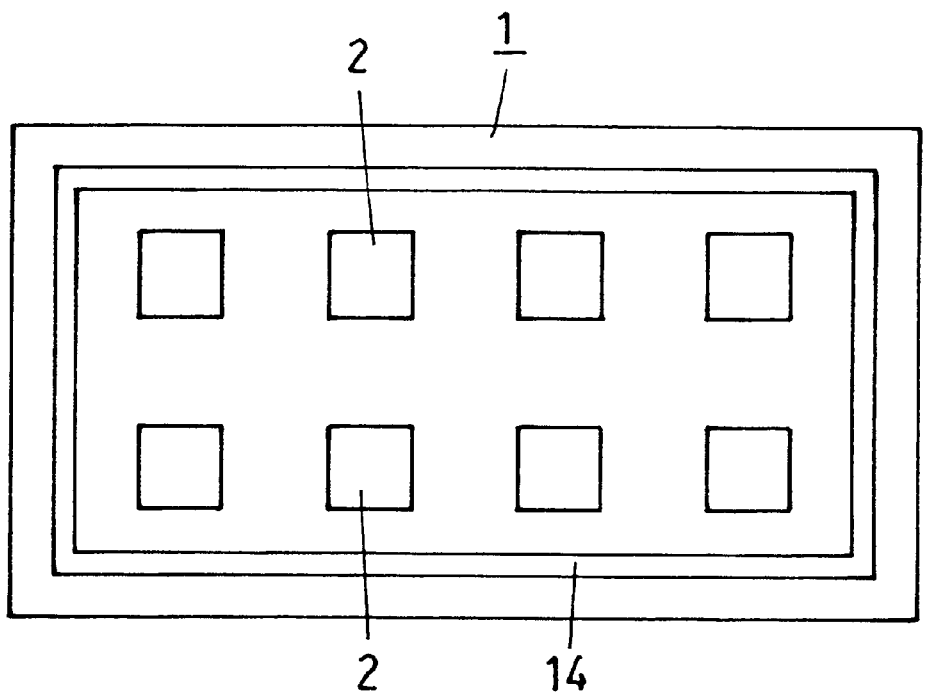
FIG. 18 is a plan view showing a state where a plurality of semiconductor integrated circuit chips are mounted on a wiring board in a conventional method of fabricating a semiconductor device.

The semiconductor device of an embodiment of the invention is now described with reference to FIG. 1. FIG. 1 is a schematic sectional view showing the construction of a semiconductor device having a PBGA structure according to the invention, wherein the constituents which are the same as those of the prior art shown in FIG. 17 are depicted by the same reference numerals.

A semiconductor device 12 shown in FIG. 1 comprises a substantially square wiring board 1 having a core formed of a resin board 13, and a semiconductor integrated circuit chip 2 mounted on the front surface of the wiring board 1 wherein each electrode of the semiconductor integrated circuit chip 2 is electrically connected to each substrate electrode 3 by connection wires 7.

Die pads 4 for fixing the semiconductor integrated circuit chips 2 using a die bond adhesive 6 and a resin insulating film 5 for covering and protecting the semiconductor integrated circuit chips 2 are respectively formed on the front surface of the wiring board 1.

A resin sealing body 8 is provided for sealing and protecting the semiconductor integrated circuit chip 2, the connection wires 7 and the substrate electrodes 3, and the resin sealing body 8 does not expose the front surface of the wiring board 1 and has peripheral portions 8a which are curved in shape as shown in FIG. 1.

A plurality of pad electrodes 9 and solder ball terminals 10 soldered onto the pad electrodes 9 are respectively provided on the back surface of the wiring board 1 for electrically connecting the wiring board 1 to a mother board, not shown. Further, a resin insulating film 5 is also provided on the back surface of the wiring board 1 for covering and protecting the wiring provided on the back surface of the wiring board 1.

Through holes 11 are provided on the wiring board 1 for electrically connecting each substrate electrode 3 provided on the front surface of the wiring board 1 and each pad electrode 9 provided on the back surface thereof.

There are provided a plurality of substrate electrodes 3, through holes 11, pad electrodes 9 and solder ball terminals 10 although only two pieces are illustrated in FIG. 1 for illustration reasons.

The construction of the semiconductor device 12 shown FIG. 1 is different from that of the conventional semiconductor device 22 in that peripheral portions 8a (particularly the upper end edge in FIG. 17) of the resin sealing body 8 of the former are curved in shape while those of the latter are not curved in shape.

Accordingly, the peripheral portions 8a of the resin sealing body 8 is not easily broken during the transportation of the semiconductor device. As a result, cracks are not produced in the resin sealing body 8 owing to the breakage of the peripheral portions 8a of the resin sealing body 8, and hence there does not arise a problem of serious impairment of the reliability of the semiconductor device.

There does not arise a problem that broken pieces produced by the breakage of the resin sealing body impede the functions of other electronic parts and the electronic part conveying unit.

Method of Fabricating a Semiconductor Device: FIGS. 1 to 12

A method of fabricating a semiconductor device according to an embodiment of the invention is now described with reference to FIGS. 1 to 12.

Figure 2:
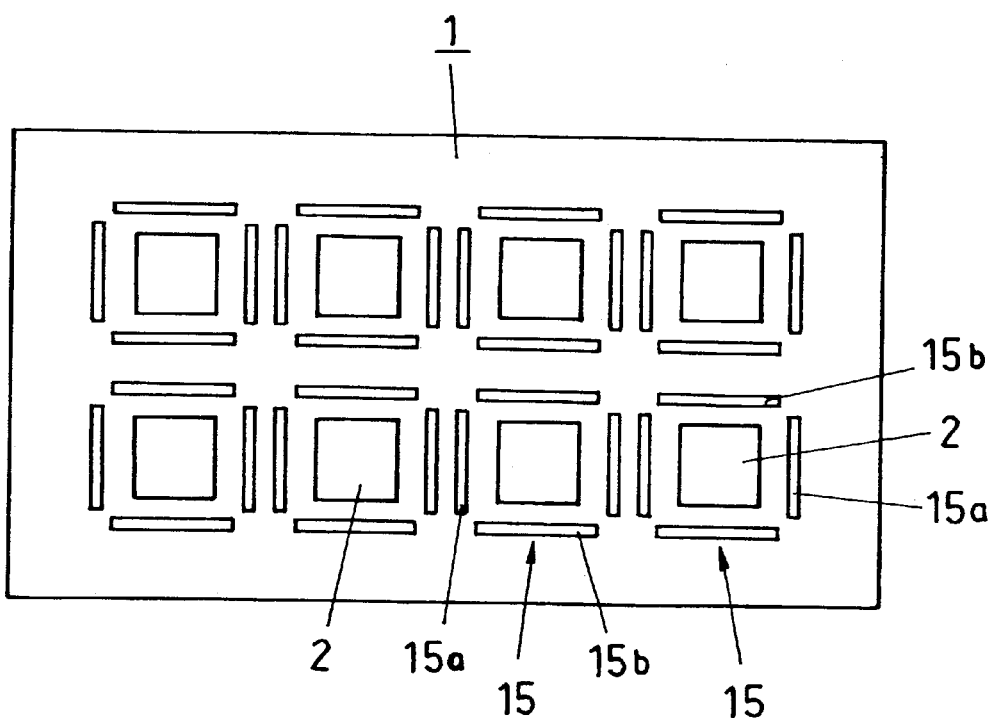
FIG. 2 is a plan view showing a state where a plurality of semiconductor integrated circuit chips are mounted on a wiring board in a method of fabricating a semiconductor device according to the invention.

FIG. 2 is a plan view showing a wiring board which is a constituent of the semiconductor device of the embodiment.

Figure 9:
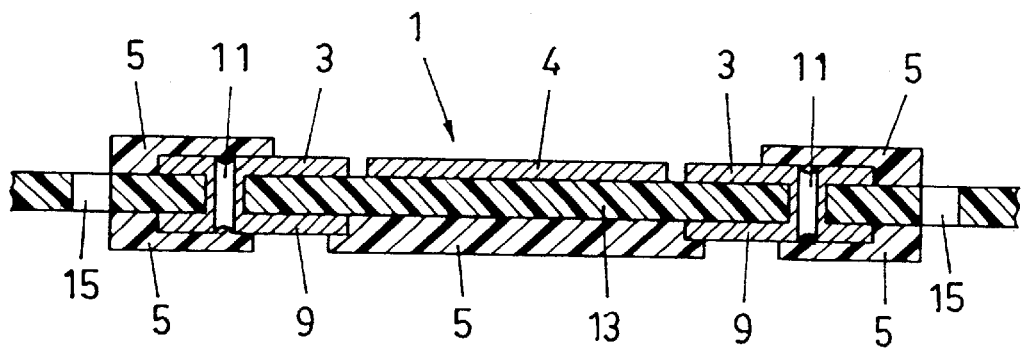
Figure 10:
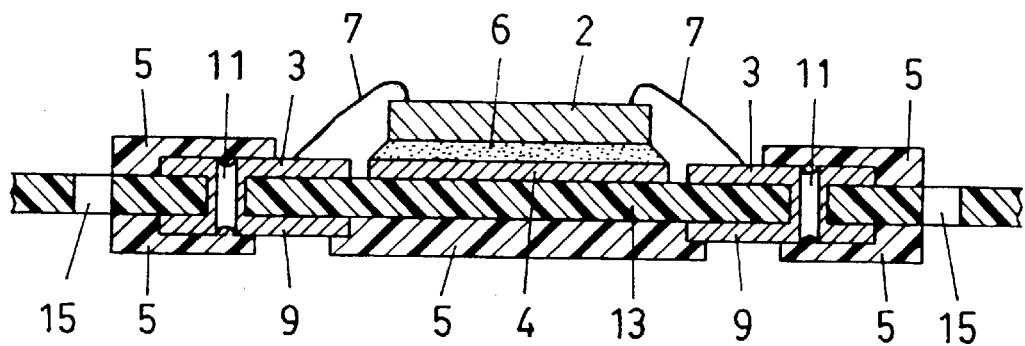
Figure 11:
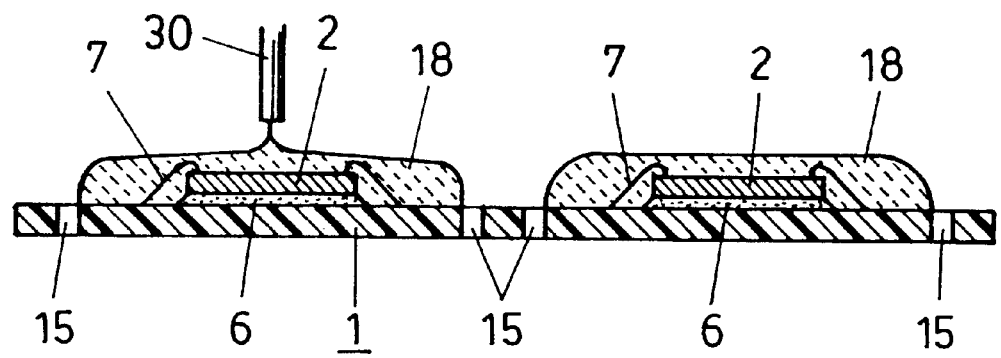
FIG. 11 is a sectional view showing a step of pouring a liquid sealing resin in the method of fabricating the semiconductor device of the invention.
Figure 12:
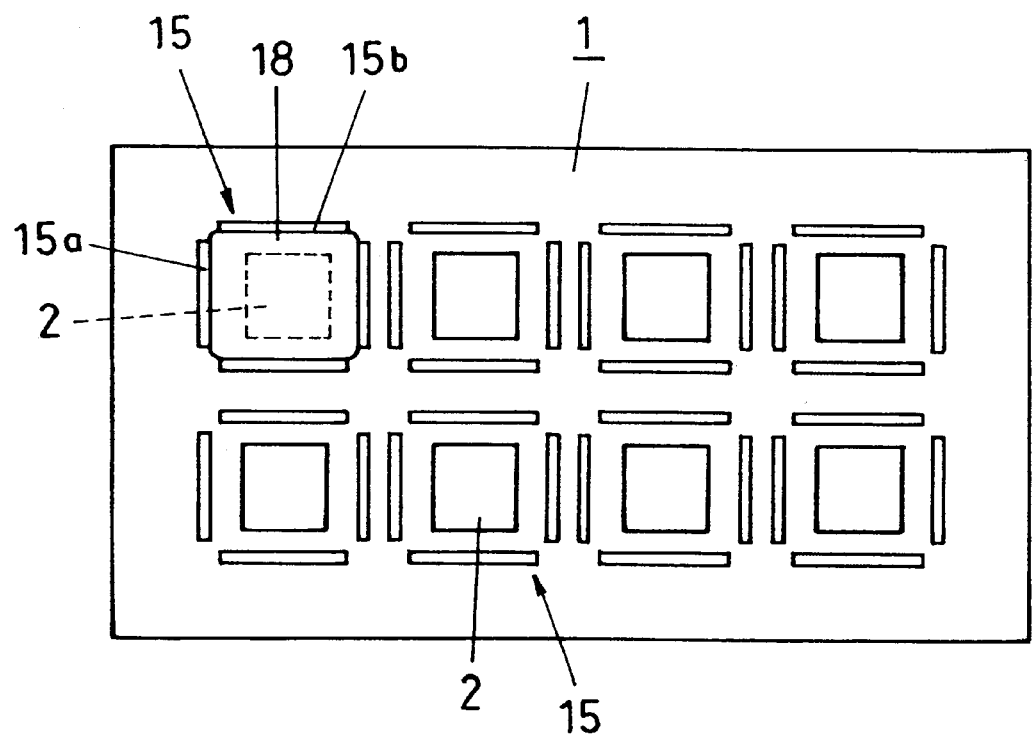
FIG. 12 is a plan view of a wiring board during the formation of a resin sealing body in the method of fabricating the semiconductor device of the invention.

FIGS. 3 to 10 are sectional views enlarging a part of a piece of a semiconductor device in each step of the method of fabricating the semiconductor device according to the embodiment of the invention. FIG. 11 is a sectional view showing a step of pouring a liquid sealing resin in the wiring board, and FIG. 12 is a plan view of a wiring board during the formation of resin sealing body.

The wiring board 1 for mounting the semiconductor integrated circuit chip 2 thereon shown in FIG. 1 is formed of a substantially square resin board 13 having a thickness of about 0.4 mm as a core. As a material of the resin board 13, a glass fiber reinforced epoxy resin or a glass fiber reinforced BT resin is employed, both having an excellent insulating property.

A plurality of semiconductor integrated circuit chips 2 can be mounted on the common wiring board 1 in given intervals, so that the fabricating time is reduced and the fabricating yield is improved.

Figure 3:
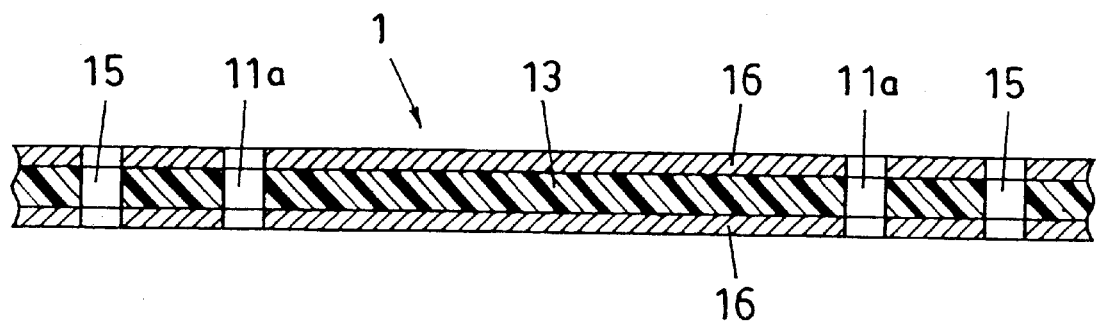
FIGS. 3 to 10 are sectional views of one enlarged semiconductor device in each step of the method of fabricating the semiconductor device according to the embodiment of the invention.

Copper foils 16 for forming wiring patterns each having a thickness of about 18 μm are stuck and fixed to the front and back surfaces of the resin board 13 forming the core of the wiring board 1 by heat pressure or the like as shown in FIG. 3.

If the wiring board 1 provided with the resin board 13 having the copper foils 16 stuck in advance onto both surfaces thereof is put on the market, the wiring board 1 can be used.

In either case, the wiring board 1 provided with the copper foil 16 stuck onto both surfaces of the resin board 13 is prepared.

Next, the wiring board 1 is perforated so as to provide substantially square outer slits 15 while leaving four corners thereof around an area of the wiring board 1 where the semiconductor integrated circuit chips 2 are mounted so as to form an outer shape of the resin sealing body for covering and protecting the semiconductor integrated circuit chips As shown in FIG. 2, the outer slits 15 are provided on each area on which the semiconductor integrated circuit chips 2 are mounted in such a way as to surround the periphery of each area by two vertically and also by two laterally, i.e., by four in total. Rooter machining or perforating machining is used as means for perforating the wiring board 1.

Further, as shown in FIG. 2, it is preferable that each distance between vertical slits 15a and lateral slits 15b provided on four corners of the outer slits iS is in the order of about 1.0 mm to 2.0 mm.

If each interval between the vertical slits 15a and lateral slits 15b is too wide, a large quantity of liquid sealing resin will protrude from the outer slits 15.

On the contrary, if each interval between the vertical slits 15a and lateral slits 15b is too narrow, the strength of the wiring board 1 is degraded and there is a possibility of a problem arising during the fabricating process.

It is preferable that the interval between the adjoining outer slits 15 which are arranged parallel to each other in FIG. 2 is in the order of about 1.0 mm to 2.0 mm.

If the interval between the adjoining outer slits 15 which are arranged parallel to each other is too narrow, the strength of the wiring board 1 is degraded and there is a possibility of a problem arising during the fabricating process.

Then, as shown in FIG. 3, cylindrical holes 11a for providing the through holes are provided on the resin board 13 having the copper foils 16 and the outer slits 15 thereon by perforating means such as a cutting drill.

Figure 4:
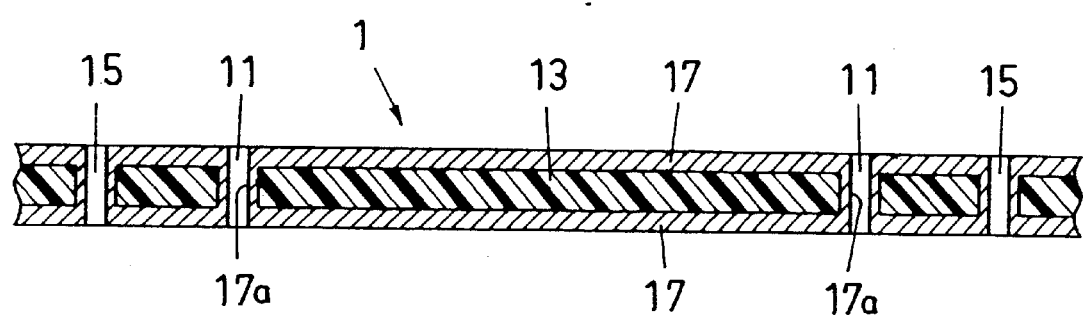

Thereafter, as shown in FIG. 4, electroless copper plating is applied to the entire surface of the perforated resin board 13 including the inner peripheral surfaces of the cylindrical holes 11a of the resin board 13, thereby forming copper plating layers 17a so that the through holes 11 are formed for electrically connecting the front and back surfaces of the resin board 13.

At this time, since the copper foils 16 provided on the resin board 13 and the copper plating layers 17a formed by plating are integrated with each other, they are hereinafter referred to as copper films 17 including the copper foils 16. Since the copper foil 16 is not present on the inner wall surfaces of the cylindrical holes 11a and the outer slits 15, only the copper plating layers 17a formed by the copper plating are present so that the thickness of each copper film 17 is tinner than the surface of the resin board 13.

Figure 5:
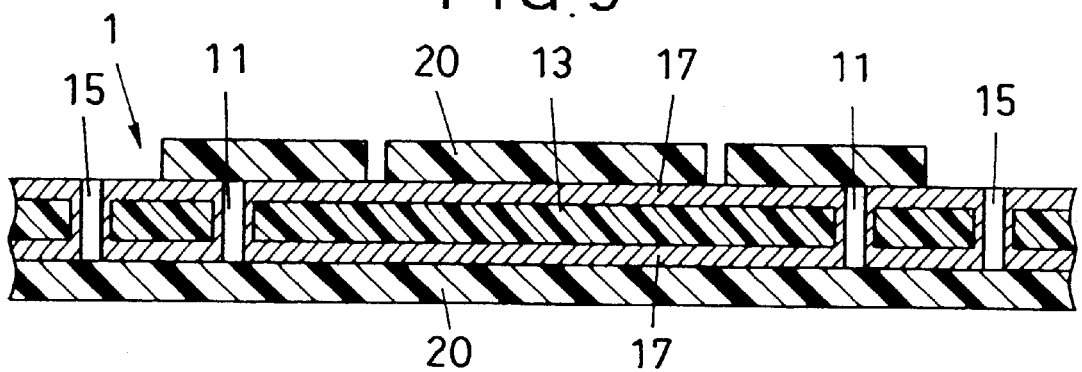

Next, a photoresist is applied onto the entire surface of the copper films 17 formed on the front and back surfaces of the wiring board 1, then a photoresist on the front surface is patterned by applying thereto exposure and development treatments, so that an etching prevention film 20 made of a photoresist is formed, as shown in FIG. 5, only at the portion of the copper film 17 where the substrate electrodes 3, the die pads 4 and the wiring patterns are formed as shown in FIG. 1. At this time, openings of the through holes 11 are covered with the etching prevention film 20.

Exposure and development treatments are not applied to the photoresist on the back surface of the wiring board 1 so that the etching prevention film 20 is formed on the entire surface of the wiring board 1.

Figure 6:
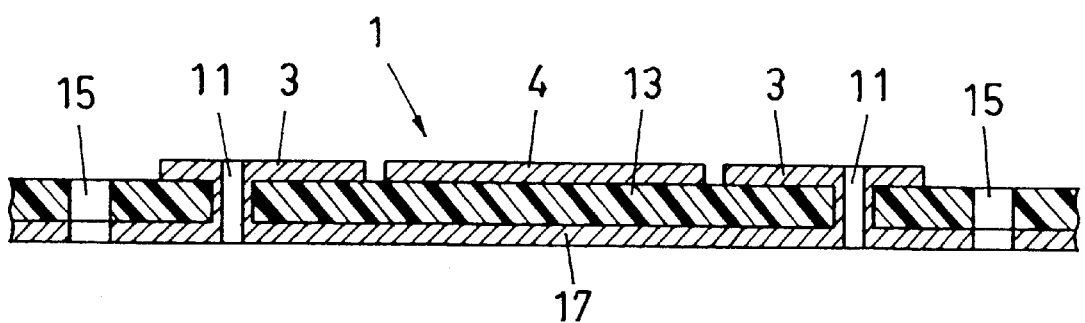

Thereafter, the wiring board 1 is etched using an etchant so as to remove the copper films 17 at the portion which is not covered with the etching prevention film 20 on the front surface thereof. When the etching prevention film 20 is removed, a plurality of substrate electrodes 3, one die pad 4 and necessary wiring patterns (not shown) are formed on the front surface of the resin board 13 relative to each semiconductor integrated circuit chip 2, as shown in FIG. 6.

Figure 7:
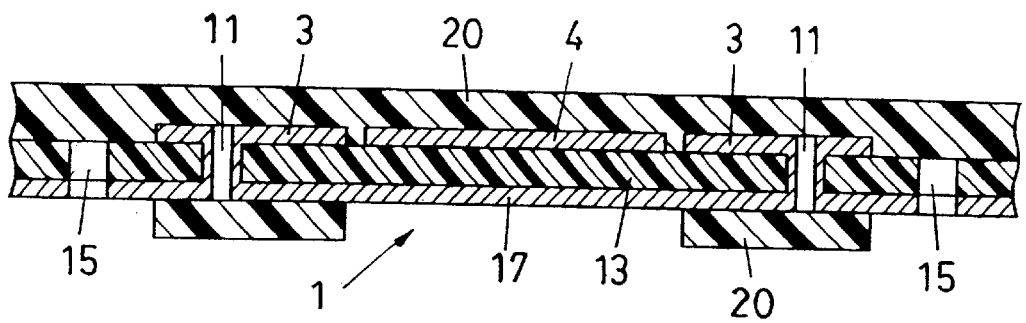

Then, the photoresist is also applied to the entire front and back surface of the wiring board 1, and the photoresist on the back surface is patterned by applying exposure and development treatments so that the etching prevention film 20 made of the photoresist is formed, as shown in FIG. 7, only at the portion of the copper film 17 where the pad electrodes 9 and the wiring pattern are formed as shown in FIG. 1. At this time, the openings of the through holes 11 are covered with the etching prevention film 20.

The exposure and development treatments are not applied to the photoresist on the front surface of the wiring board 1, thereby forming the etching prevention film 20 on the entire surface of the wiring board 1.

Figure 8:
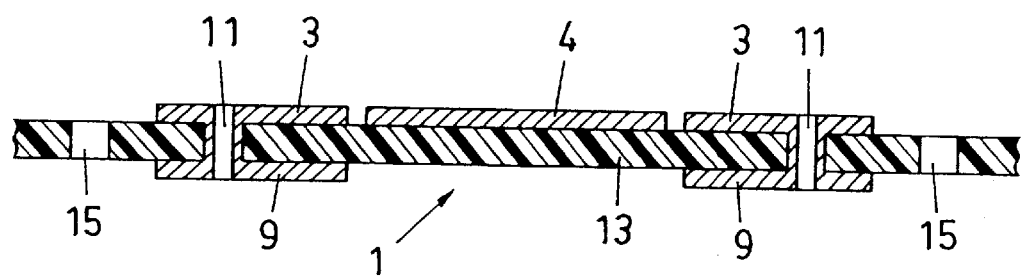

Thereafter, the wiring board 1 is etched using an etchant so as to remove the copper film 17 at the portion of the back surface which is not covered with the etching prevention film 20. When the etching prevention film 20 is removed, a plurality of pad electrodes 9 and necessary wiring patterns (not shown) are formed on the back surface of the resin board 13, as shown in FIG. 8.

As mentioned above, the wiring board 1 is designed to mount thereon a plurality of semiconductor integrated circuit chips 2. Accordingly, the number of die pads 4 provided corresponds to the number of semiconductor integrated circuit chips 2 to be mounted on the front surface of a piece of resin board 13.

The substrate electrodes 3 are arranged substantially along the respective four sides so as to surround each die pad 4.

The pad electrodes 9 are arranged in a matrix on the back surface of the resin board 13 in given intervals on every area of each semiconductor device.

Thereafter, as shown in FIG. 9, the resin insulating film 5 is provided to cover the wiring pattern and the openings of the through holes 11 while each substrate electrode 3 and die pad 4 are exposed on the front surface of the wiring board 1. The resin insulating film 5 is also provided on the back surface of the wiring board 1 while the pad electrodes 9 are exposed.

As a material of the resin insulating film 5, it is preferable to employ an acrylic resin composite or an epoxy resin composite having an excellent insulating property and photosensitivity.

That is, these resin composite is applied to the entire surface, namely, front and back surfaces of the wiring board 1, then the entire surface is patterned by applying the exposure and development treatments so as to leave the resin film on necessary portions alone, thereby forming the resin insulating films 5 on both surfaces.

With the foregoing steps, the wiring board 1 is completed. Then, as shown in FIG. 10, the semiconductor integrated circuit chips 2 are bonded onto the die pads 4 provided on the front surface of the wiring board 1 using a die bond adhesive 6. As the die bond adhesive 6, a thermosetting resin adhesive is employed. An epoxy resin adhesive having excellent adhesiveness is preferably employed.

Thereafter, a plurality of electrodes of the semiconductor integrated circuit chips 2 mounted on the wiring board 1 as shown in FIG. 2 and the substrate electrodes 3 provided around the plurality of electrodes are electrically connected to each other by the connection wires 7 as shown in FIG. 10.

As a material of the connection wire 7, an aluminum wire or a gold wire is employed, but a gold wire having excellent conductivity and corrosion resistance is preferably employed.

Then, as shown in FIG. 11, a liquid sealing resin 18 is poured inside the outer slits 15 from the upper portion of each semiconductor integrated circuit chips 2 using a supply unit such as a supply nozzle 30. If the liquid sealing resin 18 is continuously supplied, the flow of the liquid sealing resin 18 stops at the outer slits 15 owing to viscosity and surface tension thereof so that a liquid surface swells.

When the semiconductor integrated circuit chips 2 and the connection wires 7 provided on the front surface of the wiring board 1 are sufficiently concealed, the supply of the liquid sealing resin 18 is stopped.

FIG. 12 shows a state where only the inside of the outer slits 15 relative to a piece of a semiconductor integrated circuit chip 2 on the left upper portion of the wiring board 1 is filled with the liquid sealing resin 18.

The foregoing operations are performed for every semiconductor integrated circuit chip 2 mounted on the wiring board 1. Alternatively, the liquid sealing resin 18 can be supplied to a plurality of semiconductor integrated circuit chips 2 at the same time using a sealing resin supply unit having a plurality of supply nozzles 30.

As a material of the liquid sealing resin 18, a thermosetting resin composite formed of a filler such as fine powdered silica mixed with a thermosetting epoxy resin having an excellent insulating property and adhesiveness is employed. It is preferable to employ a liquid thermosetting resin composite having proper viscosity and surface tension. If viscosity is too low or surface tension is low, the outer slits 15 can not stop the flow of the liquid sealing resin 18, and hence the liquid sealing resin 18 is liable to flow outside through the outer slits 15.

Further, when the fine powdered silica is added to the liquid sealing resin, viscosity is increased so that the liquid sealing resin 18 does not flow during the heating and curing of the liquid sealing resin, thereby obtaining the resin sealing body 8 having an excellent shape. Further, when the fine powdered silica is added to the liquid sealing resin, thermal expansion rate or water absorption rate is improved to obtain a semiconductor device having an excellent reliability.

Then, the liquid sealing resin 18 is heated and cured to form the resin sealing body 8. In this embodiment, the outer slits 15 are provided on the wiring board 1 to form the outer shape of the resin sealing body 8. Accordingly, the resin sealing body 8 is obtained in every semiconductor integrated circuit chip 2, shown in FIG. 12.

It is preferable that the liquid sealing resin 18 is supplied to all the semiconductor integrated circuit chips 2 on the wiring board 1, then the liquid sealing resin 18 is heated and cured at a time, thereby forming the resin sealing body 8.

Thereafter, solder balls each having a diameter in the order of 0.6 to 0.8 mm are supplied to each pad electrode 9 formed on the back surface of the wiring board 1 and they are heated using a heating furnace to solder the respective pad electrodes 9, thereby forming the solder ball terminals 10 shown in FIG. 1.

Thereafter, the portions between the vertical slits 15a and the lateral slits 15b on the four corners of the outer slits 15 provided on the wiring board 1 are cut every semiconductor integrated circuit chips 2 into individual separate semiconductor devices 12 each having a PBGA structure.

As mentioned above, the method of fabricating the semiconductor device of the invention is greatly different from the conventional method in that the invention has a step of providing the outer slits 15 for forming the outer shape of the resin sealing body 8 on the wiring board 1 and the step of pouring the liquid sealing resin 18 for forming the resin sealing body 8 inside the outer slits 15 provided around the semiconductor integrated circuit chip 2 every semiconductor integrated circuit chips 2 mounted on the common wiring board 1, before heating and curing the liquid sealing resin 18.

Further, the invention is different from the conventional method in that after the resin sealing bodies 8 are formed relative to all the semiconductor integrated circuit chips 2, the positions remaining on four corners of the outer slits 15 on the wiring board 1 are cut into individual separate semiconductor devices 12 each having the PBGA structure in every semiconductor integrated circuit chips 2.

With the employment of the method of the invention, it is possible to obtain the semiconductor devices 12 provided with the resin sealing body 8 having the curved peripheral portions 8a (upper end edge portions) without exposing the front surface of the wiring board 1 as shown in FIG. 1.

Accordingly, the peripheral portions 8a of the resin sealing body 8 are not easily broken. As a result, there does not arise a problem that cracks are produced in the resin sealing body 8 owing to the breakage of the peripheral portions 8a of the resin sealing body 8 to seriously impair a reliability of the semiconductor device. Further, there does not arise a problem that broken pieces generated by the breakage of the peripheral portions 8a impede the functions of other electronic parts and part conveying units.

Further, it is possible to provide the resin sealing bodies 8 individually in every semiconductor integrated circuit chip 2 by the outer slits 15 in the step of sealing a plurality of semiconductor integrated circuit chips 2 mounted on the wiring board 1 with the liquid sealing resin 18.

Accordingly, even in the case of sealing the wiring board 1 on which a plurality of semiconductor integrated circuit chips 2 are mounted, the volume of the cured sealing resin is not increased to suppress the shrinkage of volume due to curing, so that the wiring board 1 is not warped.

As a result, when the semiconductor device 12 is severed from the wiring board 1 into individual pieces, a stress is not applied to the wiring board 1 and there does not arise a problem of the occurrence of exfoliation and breakage of the semiconductor integrated circuit chips 2 and the resin sealing body 8.

Method of Fabricating a Semiconductor Device according to Another Embodiment: FIGS. 1, 2 and FIGS. 13 to 16

A method of fabricating a semiconductor device according to another embodiment of the invention is described.

FIGS. 13 to 16 are sectional views corresponding to FIGS. 3 to 5 for explaining another embodiment of the invention.

In the aforesaid method, the step of perforating the wiring board 1 having the copper foils 16 stuck on the front and back surfaces of the resin board 13 is effected first to provide the outer slits 15 for forming the resin sealing bodies 8 relative to the semiconductor integrated circuit chips to be mounted on the wiring board 1.

However, the step of perforating the wiring board 1 to provide the outer slits 15 may be effected at any step if this step is effected before the step of supplying the liquid sealing resin 18 to the semiconductor integrated circuit chips inside the outer slits 15 to form the resin sealing body 8 by heating and curing the liquid sealing resin 18.

Figure 13:
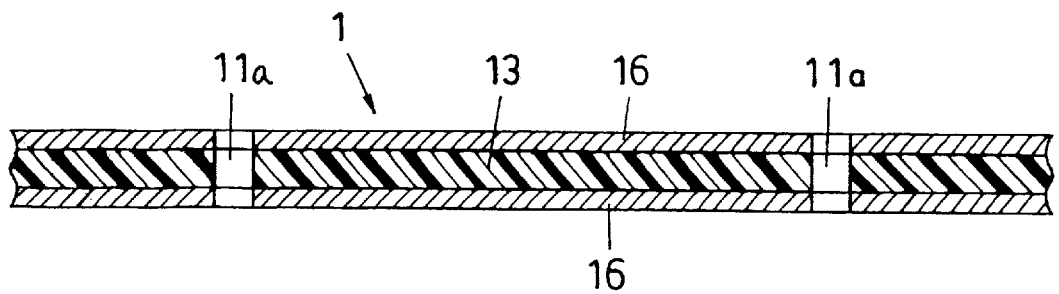
FIGS. 13 to 16 are sectional views of one semiconductor device in each step of the method of fabricating the semiconductor device according to another embodiment of the invention.

For example, in this embodiment, firstly as shown in FIG. 13, cylindrical holes 11a for providing the through holes on the wiring board 1 having the copper foils 16 on the front and back surfaces of the resin board 13 are provided by perforating means such as a cutting drill.

Figure 14:
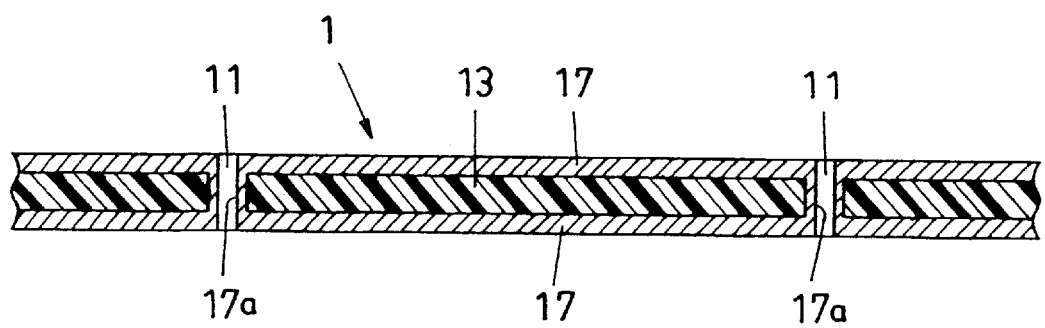

Thereafter, as shown in FIG. 14, a copper plating layer 17a is formed by electroless plating treatment on the entire surface of the perforated resin board 13 including the inner peripheral surfaces of the cylindrical holes 11a, thereby forming through holes 11 for electrically connecting the front and back surfaces of the wiring board 1.

At this time, since the copper foil 16 provided on the resin board 13 and the copper plating layer 17a formed by plating are integrated with each other, they are hereinafter referred to as a copper film 17 including the copper foil 16.

Figure 15:
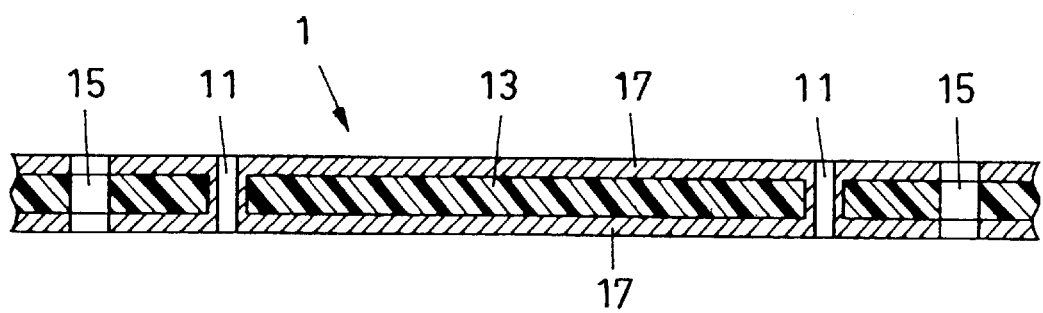

Next, as shown in FIG. 15, the wiring board 1 is perforated so as to provide substantially square outer slits 15 while leaving four corners thereof around an area where the semiconductor integrated circuit chips 2 are mounted on the wiring board 1 so as to form an outer shape of the resin sealing body for covering and protecting the semiconductor integrated circuit chips (see FIG. 2)

As set forth above, if the provision of the outer slits 15 is effected after electroless copper plating treatment, copper plating layers 17a are not formed on the inner wall surfaces of the outer slits 15 by plating.

Figure 16:
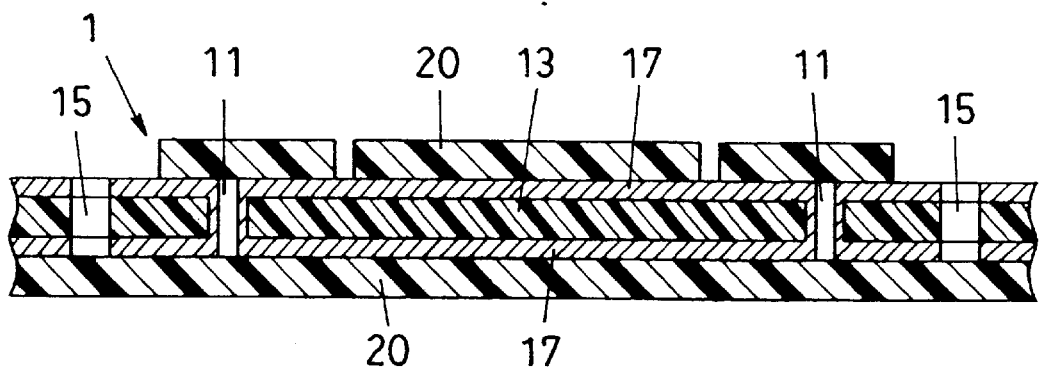

Next, a photoresist is applied onto the front and back surfaces of the wiring board 1, then the photoresist on the front surface is patterned by applying thereto exposure and development treatments, so that an etching prevention film 20 made of the photoresist is formed on the front surface of the wiring board 1, as shown in FIG. 16, only at the portion of the copper film 17 where the substrate electrodes 3, the die pads 4 and the wiring patterns are formed. The etching prevention film 20 is also formed on the entire back surface of the wiring board 1.

Thereafter, the wiring board 1 is etched using an etchant so as to remove the copper film 17 at the portion which is not covered with the etching prevention film. When the etching prevention film is removed thereafter, substrate electrodes 3, one die pad 4 and a wiring pattern are formed on the front surface of the resin board 13 in the same manner as shown in FIG. 6 of the first embodiment.

The subsequent steps are the same as those of the first embodiment, and hence they are omitted.

The step of perforating the wiring board 1 to provide the outer slits 15 may be effected after the step of forming the copper films 17 by copper plating treatment. Alternatively, the step of perforating the wiring board 1 to provide the outer slits 15 may be effected after the step of patterning the copper films 17 on the front surface of the wiring board 1 to form the substrate electrodes 3, the die pads 4 and so forth, or after the step of patterning the copper film 17 on the back surface of the wiring board 1 to form the pad electrodes or the like.

Alternatively, the step of perforating the wiring board 1 to provide the outer slits 15 may be effected after the step of forming resin insulating films on the front and back surfaces of the wiring board 1, or after the step of fixing the semiconductor integrated circuit chips 2 onto the die pad 4 on the front surface of the wiring board 1 by an adhesive or after the step of electrically connecting each electrode of the semiconductor integrated circuit chips 2 and each substrate electrode.

As set forth above, even if the wiring board 1 is perforated to provide the outer slits 15 subsequent to any of the steps, if the liquid sealing resin 18 is thereafter supplied to the semiconductor integrated circuit chips 2 inside each outer slit 15, and the liquid sealing resin 18 is heated and cured to form the resin sealing body 8, then cutting four corners in each outer slit 15 on the circuit board, the semiconductor device having the PBGA structure in the same manner as the first embodiment can be obtained. Each peripheral portion 8a of the resin sealing body 8 of the semiconductor device is curved in shape. Effect of the Invention As is evident from the above explanation, according to the semiconductor device of the invention, the peripheral portions of the sealing body for protecting the semiconductor integrated circuit chips are curved in shape. Accordingly, the peripheral portions (particularly upper end edge portions) of the sealing body are not easily broken during the transportation of the semiconductor device. As a result, there does not arise a problem of a serious impairment of reliability of the semiconductor device caused by the breakage of the peripheral portions of the sealing body to produce cracks in the sealing body. Further, there does not arise a problem that the broken pieces produced by the breakage of the peripheral portions impede the functions of other electronic parts and parts conveying units.

Further, the method of fabricating the semiconductor device of the invention has a step of perforating the wiring board for providing the outer slits so as to form the sealing body to cover and protect the semiconductor integrated circuit chip while leaving four corners of the outer slits, the step of forming the sealing body inside the outer slits on every semiconductor integrated circuit chip, and the step of cutting the four corners of the outer slits where the wiring board is not perforated for providing the outer slits.

With the employment of this method, it is possible to easily fabricate the semiconductor device having the PBGA structure provided with the resin sealing body having the peripheral portions curved in shape for covering the entire front surface of the wiring board.

Further, even if the wiring board on which a plurality of semiconductor integrated circuit chips are mounted is sealed with a resin, volume of the cured sealing resin is not increased so that the shrinkage of volume of the cured sealing resin owing to the curing can be suppressed, and the wiring board is not warped.

As a result, a stress is not applied to the wiring board when cutting the respective semiconductor devices from the wiring board into individual ones, and exfoliation or breakage of the semiconductor integrated circuit chips and resin sealing body is not generated, so that a semiconductor device having a high reliability is obtained.

What is claimed is:

1. A method of fabricating a semiconductor device comprising the steps of:

preparing a wiring board by forming copper foils on front and back surfaces of a resin board;

perforating the wiring board for providing through holes;

a copper plating step for applying copper plating to the wiring board on the entire surface thereof including inner peripheral surfaces of holes so as to provide the through holes for electrically connecting the copper foils to copper films formed of copper plated layers respectively on the front and back surfaces of the wiring board;

a first patterning step for patterning the copper film on the front surface of the wiring board for forming a plurality of substrate electrodes to be electrically connected to each electrode of the semiconductor integrated circuit chip;

a second patterning step for patterning the copper film on the back surface of the wiring board to form a plurality of pad electrodes electrically connected to each substrate electrode through the through holes so as to solder a plurality of solder ball terminals;

forming resin insulating films on the front and back surfaces of the wiring board while each substrate electrode and each pad electrode are exposed;

fixing the semiconductor integrated circuit chip onto a substantially central portion of the front surface of the wiring board using an adhesive;

a connecting step for electrically connecting each electrode of the semiconductor integrated circuit chip and each substrate electrode by connection wires;

perforating the wiring board for providing substantially square outer slits so as to form the outer shape of a resin sealing body for protecting the semiconductor integrated circuit chip while leaving four corners of the outer slits, said perforating step being effected subsequently to either step of the foregoing steps ranging from the step of preparing the wiring board to the connecting step;

forming a resin sealing body for covering and protecting the semiconductor integrated circuit chip on the wiring board and the entire surface of the inner side of the outer slits including the substrate electrode;

soldering the solder ball terminals onto each pad electrode; and cutting the four corners of the outer slits where the wiring board is not perforated to provide the outer slits.

2. The method of forming the semiconductor device according to claim 1, wherein the step of forming the resin sealing body is a step of supplying a thermosetting liquid sealing resin to the entire surface of the outer slits including the semiconductor integrated circuit chips inside the outer slits, then heating and curing the sealing resin to form the resin sealing body.

* * * * *